(12) United States Patent
McDonald et al.

(10) Patent No.: US 7,952,418 B2
(45) Date of Patent: May 31, 2011

(54) ENHANCED TRANSISTOR GATE DRIVE

(75) Inventors: Brent A. McDonald, Murphy, TX (US);
George G. Richards, III, Round Rock, TX (US); Brian P. Johnson, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 12/163,072

(22) Filed: Jun. 27, 2008

(65) Prior Publication Data
US 2009/0322405 A1 Dec. 31, 2009

(51) Int. Cl.
*H03K 17/687* (2006.01)
(52) U.S. Cl. ........ 327/427; 327/108; 327/374; 327/379; 327/437; 327/378
(58) Field of Classification Search .................. 327/108, 327/374–377, 379, 437, 378, 382–384, 427, 327/434–435
See application file for complete search history.

(56) References Cited

U.S. PATENT DOCUMENTS

| | | | |
|---|---|---|---|
| 5,332,938 A | 7/1994 | McEwan | |
| 6,107,860 A | 8/2000 | Vinciarelli | |
| 6,593,622 B2 | 7/2003 | Kinzer et al. | |
| 2002/0171455 A1* | 11/2002 | Tsuchida et al. | 327/108 |
| 2006/0006922 A1 | 1/2006 | Sander | |

* cited by examiner

*Primary Examiner* — Lincoln Donovan
*Assistant Examiner* — Shikha Goyal
(74) *Attorney, Agent, or Firm* — Baker Botts L.L.P.

(57) ABSTRACT

An enhanced transistor gate drive is disclosed in which a pair of Kelvin sense leads measure the voltage potential across at the gate and source of the transistor. The difference in the voltage potential of the Kelvin sense lead from the gate and the Kelvin sense lead of the source is provided to a voltage controlled current source, which compares the output of the voltage differentiator to an oscillating voltage input. Changes to the voltage difference between the Kelvin sense connectors will result in more or less voltage being applied at the gate of the transistor, thereby parasitic inductance in the transistor from causing the device to switch on and off.

15 Claims, 1 Drawing Sheet

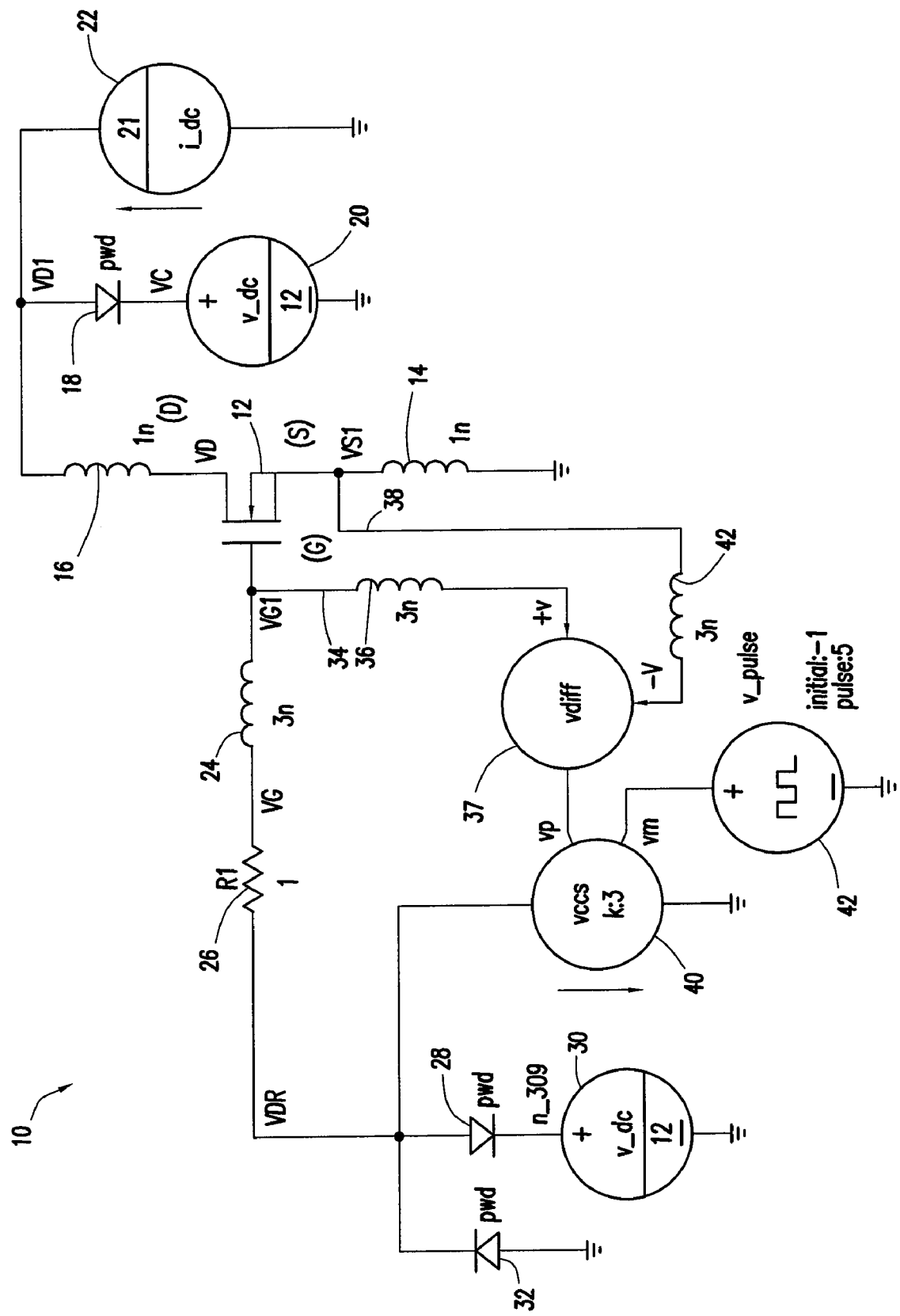

US 7,952,418 B2

ENHANCED TRANSISTOR GATE DRIVE

TECHNICAL FIELD

The present disclosure relates generally to electronics for computer systems and information handling systems, and, more particularly, to an enhanced transistor gate drive.

BACKGROUND

As the value and use of information continues to increase, individuals and businesses seek additional ways to process and store information. One option available to these users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may vary with respect to the type of information handled; the methods for handling the information; the methods for processing, storing or communicating the information; the amount of information processed, stored, or communicated; and the speed and efficiency with which the information is processed, stored, or communicated. The variations in information handling systems allow for information handling systems to be general or configured for a specific user or specific use such as financial transaction processing, airline reservations, enterprise data storage, or global communications. In addition, information handling systems may include or comprise a variety of hardware and software components that may be configured to process, store, and communicate information and may include one or more computer systems, data storage systems, and networking systems.

A metal oxide semiconductor field effect transistor (MOSFET) may suffer losses from energy and power dissipation as the transistor is turned on and off at its gate. Losses in energy and power dissipation due to turning the device on and off are referred to as switching loss. When the transistor is turned on or turned off, the packaging of the device generates parasitic inductance in the transistor and causes changes in the applied voltage at the gate of the transistor. The polarity of the voltage generated by the parasitic inductance tends to reduce the drive voltage, forcing the transistor to cut off from an on state, which increases the turn on and turn off times for the transistor and reduces the efficiency and increases the power consumption of the transistor. The parasitic inductance could also generate a voltage at the gate that will cause the transistor to turn on from an off state, generating additional switching losses as the transistor returns to an off state.

SUMMARY

In accordance with the present disclosure, an enhanced transistor gate drive is disclosed in which a pair of Kelvin sense leads measure the voltage potential across the gate and source of the transistor. The difference in the voltage potential of the Kelvin sense lead from the gate and the Kelvin sense lead of the source is provided to a voltage controlled current source, which compares the output of the voltage differentiator to an oscillating voltage input. Changes to the voltage difference between the Kelvin sense connectors will result in more or less voltage being applied at the gate of the transistor, thereby preventing parasitic inductance in the transistor from causing the device to switch on and off.

The enhanced transistor gate drive described herein is technically advantageous because it provides for an enhanced drive that compensates for the existence in the parasitic inductance in the transistor. Because the existence of parasitic inductance is compensated for at the gate of the transistor, the gate can be controlled in a manner that is more predictable and reduces or eliminates the device being cut off while in an on state or turned on when in an off state. The enhanced transistor gate drive described herein is also advantageous because switching losses in the transistor circuit are reduced. Because the transistor circuit is not unexpectedly turning on and off, switching losses associated with unexpected transitions from one operating state to another are eliminated. Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 1 is a circuit diagram of an enhanced gate drive circuit.

DETAILED DESCRIPTION

Shown in FIG. 1 is a circuit diagram of an enhanced gate drive circuit, which is indicated generally at 10. Circuit 10 includes an n-channel MOSFET at 12. Transistor 12 includes a source (S), which is coupled between an inductor 14 and ground. The drain (D) of transistor 12 is coupled across an inductor 16, which is coupled to ground across a diode 18 and a DC voltage source 20. Inductor 16 is also coupled to ground across a DC voltage source 22. The gate (G) of transistor 12 is coupled in series to an inductor 24 and a resistor 26. Resistor 26 is coupled to ground across a diode 28 and a DC voltage source 30. Resistor 26 is also coupled to ground across a rectifying diode 32.

Circuit 10 includes a pair of Kelvin sense leads. A first Kelvin sense lead 34 is coupled to the gate of transistor and across an inductor 36 to a voltage differentiator 37. A second Kelvin sense lead 38 is coupled to the source of transistor 12 and across an inductor 42 to voltage differentiator 37. Voltage differentiator 37 has the function of a subtract block. Voltage differentiator 37 measures and provide as an output the voltage difference between the voltage potential from Kelvin sense lead 34 and the voltage potential from Kelvin sense lead 38.

The output of voltage differentiator 37 is applied to voltage-controlled current source 40. The resulting current passed through voltage controlled current source 40 is the difference between the output of the voltage differentiator and an oscillating voltage input 42, which is coupled between voltage controlled current source 40 and ground. Voltage input 42 is an oscillating gate drive signal. Diode 28, DC voltage source 30, and rectifying diode 32 serve as a clamp for the voltage controlled current source 40. In operation, changes in the voltage the gate and the source of the transistor 12 are measured at voltage differentiator 37. When a voltage is applied at the gate to cause the transistor to turn on, the voltage potential at Kelvin sense lead 34 is higher than the voltage potential at Kelvin sense lead 38, resulting in a high differential voltage being applied by voltage differentiator 37 to voltage controlled current source 40. To the extent that the differential voltage applied by voltage differentiator is higher than the oscillating voltage input, the current output of voltage controlled current source rises or is high, which maintains or adds to a high voltage level at the gate of transistor 12. This differential voltage at turn-on of transistor 12 will fall over time.

The differential voltage applied to voltage controlled current source 40 will fall over time as the current di/dt decreases across the transistor as parasitic inductive effects are created in the packaging of the transistor and measured by Kelvin sense lead 38. A lower differential voltage, as measured by voltage differentiator and applied at voltage controlled current source 40. As the differential voltage falls in value, the lower the output of voltage controlled current source and less differential voltage is added to the gate of transistor 12. Thus, the operation of transistor 12 provides a cushion against parasitic inductance in the packaging of the transistor causing the transistor to be cut off during periods in which the transistor is being turned on.

Similarly, when transistor 42 is transition from an on state to an off state, the voltage at the gate of transistor 12 will become lower than the voltage at the source of transistor 12, resulting in a lower or negative voltage differential at the output of voltage differentiator 37. The comparison of the output of voltage differentiator 37 to the oscillating voltage input 42 causes the current of the current source to be lower, which tends to reduce the voltage at the gate of the transistor, thereby maintaining the transistor in the off state and preventing the transistor from turning on or smoothing the transition to the off state and preventing the transistor from turning back on during this transitional period. The operation of the transistor circuit of FIG. 1 involves using the voltage controlled current source 40 to move the voltage at $V_{DR}$ up or down so that the output of voltage differentiator 37 tracks the output of the oscillating voltage input 42 to compensate for the inductance effects of inductors 24 and 14 at the gate and source, respectively, of the circuit.

In the circuit described herein, the Kelvin sense leads drive the voltage applied at the gate of the transistor and the voltage potential between the gate and the source of the transistor. In this way, parasitic inductance in the packaging of the device is measured, and the voltage potential between the gate and the source is set or driven to prevent the device from being cut off, especially during a transition to an off state. The use of Kelvin sense leads and the comparison of parasitic inductance levels in the gate and the source of the circuit tends to prevent parasitic inductance in the packaging from interfering with the on and off transitions of the transitions. Because the on and off transitions of the transistor are not interrupted or inductance levels in the packaging of the transistor, switching is more predictable and switching losses are minimized. Because switching losses are minimized, the transistor consumes less power and is less costly as a result. Although the present disclosure has been described in detail, it should be understood that various changes, substitutions, and alterations can be made hereto without departing from the spirit and the scope of the invention as defined by the appended claims.

What is claimed is:

1. A transistor circuit, comprising:
   a transistor having a gate and a source;
   a voltage differentiator coupled between the gate and the source of the transistor;
   wherein the gate of the transistor is coupled to a first Kelvin sense lead;
   wherein the source of the transistor is coupled to a second Kelvin sense lead;
   wherein the voltage at the first Kelvin sense lead is compared to the voltage at the second Kelvin sense lead at the voltage differentiator, wherein an output of the voltage differentiator is operable to control the voltage potential between the gate and the source of the transistor, and wherein the output of the voltage differentiator comprises a voltage differential between the voltage at the first Kelvin sense lead and the voltage at the second Kelvin sense lead; and
   wherein a transition of the transistor to an on state causes the voltage at the first Kelvin sense lead to be higher than the voltage at the second Kelvin sense lead, causing a voltage controlled current source to raise the voltage applied at the gate to prevent the gate from being cut off.

2. The transistor circuit of claim 1, wherein the output of the voltage differentiator is applied to a current source that controls the amount of current sourced to ground to manage the voltage applied at the gate of the transistor.

3. The transistor circuit of claim 2, wherein the inputs to the voltage controlled current source are the output of the voltage differentiator and an oscillating voltage source.

4. The transistor circuit of claim 3, wherein a transition of the transistor to an off state causes voltage potential of the first Kelvin sense lead to fall relative to the voltage potential of the second Kelvin sense lead, causing the voltage controlled current source to lower the voltage applied at the gate to prevent the gate from being turned on.

5. The transistor circuit of claim 1, wherein a change in the relative voltage potential of the first Kelvin sense lead as compared to the voltage potential of the second Kelvin sense lead results in a change of voltage applied at the gate of the transistor.

6. A method for controlling the operation of a transistor having a gate and a source, comprising:
   measuring at a first Kelvin sense lead the voltage at the gate of the transistor;
   measuring at a second Kelvin sense lead the voltage at the source of the transistor;
   comparing the voltage at the first Kelvin sense lead and the voltage at the second Kelvin sense lead, wherein the comparing step is performed by a voltage differentiator coupled to the first Kelvin sense lead and the second Kelvin sense lead;
   controlling the voltage potential between the gate and the source of the transistor on the basis of an output of the voltage differentiator comprising a voltage differential between the voltage at the first Kelvin sense lead and the voltage at the second Kelvin sense lead, wherein the step of controlling the voltage potential between the gate and source of the transistor comprises causing a voltage controlled current source to raise the voltage applied at the gate to prevent the gate from being cut off when the transistor is in an on state.

7. The method for controlling the operation of a transistor of claim 6, wherein the output of the voltage differentiator is applied to a current source that controls the amount of current sourced to ground to manage the voltage applied at the gate of the transistor.

8. The method for controlling the operation of a transistor of claim 7, wherein the inputs to the voltage controlled current source are the output of the voltage differentiator and an oscillating voltage source.

9. The method for controlling the operation of the transistor of claim 6, wherein the step of controlling the voltage potential between the gate and source of the transistor comprises causing the voltage controlled current source to lower the voltage applied at the gate to prevent the gate from being turned on when the transistor is in an off state.

10. The method for controlling the operation of the transistor of claim 6, wherein the step of controlling the voltage potential between the gate and source of the transistor comprises supplying additional voltage to the gate during the period that the transistor is transitioning to an on state to prevent the transistor from being cut off.

11. The method for controlling the operation of the transistor of claim 6, wherein the step of controlling the voltage potential between the gate and source of the transistor comprises reducing the supply of voltage to the gate during the period that the transistor is transitioning to an off state to prevent the transistor from being turned on.

12. A transistor circuit, wherein the transistor includes a gate and a source, comprising:
   a first Kelvin sense lead coupled to the gate;
   a second Kelvin sense lead coupled to the source;
   a voltage differentiator operable to measure the voltage difference between the voltage at the first Kelvin sense lead and the voltage at the second Kelvin sense lead, wherein an output of the voltage differentiator comprises a voltage differential between the voltage at the first Kelvin sense lead and the voltage at the second Kelvin sense lead;
   a voltage controlled current source operable to output less or more current in response to the output of the voltage differentiator in order to control the voltage applied at the gate of the transistor, wherein a transition of the transistor to an on state causes the voltage at the first Kelvin sense lead to be higher than the voltage at the second Kelvin sense lead, causing the voltage controlled current source to raise the voltage applied at the gate to prevent the gate from being cut off.

13. The transistor circuit of claim 12, wherein the inputs to the voltage controlled current source are the output of the voltage differentiator and an oscillating voltage source.

14. The transistor circuit of claim 12, wherein a transition of the transistor to an off state causes voltage potential of the first Kelvin sense lead to fall relative to the voltage potential of the second Kelvin sense lead, causing the voltage controlled current source to raise the voltage applied at the gate to prevent the gate from being cut off.

15. The transistor circuit of claim 12, wherein a change in the relative voltage potential of the first Kelvin sense lead as compared to the voltage potential of the second Kelvin sense lead results in a change of voltage applied at the gate of the transistor.

* * * * *